United States Patent
Rochette et al.

(10) Patent No.: US 11,539,105 B2
(45) Date of Patent: Dec. 27, 2022

(54) MULTISCALE VECTOR CONSTELLATION

(71) Applicant: THALES, Courbevoie (FR)

(72) Inventors: Stéphane Rochette, Toulouse (FR); Thierry Adam, Toulouse (FR); Benjamin Therond, Toulouse (FR); Vincent Armengaud, Toulouse (FR)

(73) Assignee: THALES, Courbevoie (FR)

( * ) Notice: Subject to any disclaimer, the term of this patent is extended or adjusted under 35 U.S.C. 154(b) by 368 days.

(21) Appl. No.: 16/920,505

(22) Filed: Jul. 3, 2020

(65) Prior Publication Data

US 2021/0005946 A1    Jan. 7, 2021

(30) Foreign Application Priority Data

Jul. 4, 2019 (FR) .................................. 1907443

(51) Int. Cl.
| | |
|---|---|
| *H03H 7/24* | (2006.01) |
| *H01P 1/22* | (2006.01) |
| *H01Q 1/28* | (2006.01) |
| *H01Q 3/38* | (2006.01) |
| *H03H 7/25* | (2006.01) |

(52) U.S. Cl.
CPC ............... *H01P 1/22* (2013.01); *H01Q 1/288* (2013.01); *H01Q 3/38* (2013.01); *H03H 7/25* (2013.01)

(58) Field of Classification Search
CPC ............ H03H 7/25; H03H 7/24; H03H 7/253; H03H 7/255; H03H 7/256; H01P 1/22; H02H 11/24; H02H 11/245; H01Q 1/288; H01Q 3/38
See application file for complete search history.

(56) References Cited

U.S. PATENT DOCUMENTS

| | | | |
|---|---|---|---|
| 5,661,489 A | 8/1997 | Baker | |
| 9,531,359 B1 * | 12/2016 | Shrivastava | H03H 11/245 |

FOREIGN PATENT DOCUMENTS

| | | |
|---|---|---|
| EP | 3324540 A1 | 5/2018 |
| FR | 2338582 A1 | 8/1977 |

* cited by examiner

*Primary Examiner* — Stephen E. Jones
(74) *Attorney, Agent, or Firm* — BakerHostetler

(57) ABSTRACT

An attenuator is configured to attenuate and phase-shift a radiofrequency signal according to a control signal, having a plurality of first attenuation cells ($A_1, A_{N-1}$), configured to attenuate said radiofrequency signal by a predetermined value and activated according to a particular bit of the control signal, and implementing a combinatorial logic on the bits of the control signal that are used to control the first attenuation cells, and at least one second attenuation cell ($B_1, B_M$) configured to attenuate said radiofrequency signal by a predetermined value and activated according to a particular output implementing the combinatorial logic. A control node is also provided for an array antenna having such an attenuator, and an array antenna having an array of such control node and a satellite.

11 Claims, 11 Drawing Sheets

MULTISCALE VECTOR CONSTELLATION

CROSS-REFERENCE TO RELATED APPLICATION

This application claims priority to foreign French patent application No. FR 1907443, filed on Jul. 4, 2019, the disclosure of which is incorporated by reference in its entirety.

FIELD OF THE INVENTION

The invention is based in the field of radiofrequency transmissions (RF), and relates more particularly to a device for controlling the amplitude and phase of an RF signal, or control node, used within a beamforming network for array antennas, in particular for satellite communications.

BACKGROUND

Array antennas, whether they are active or passive, are antennas composed of a plurality of radiating elements used to transmit or receive an RF signal. The amplitude and phase of the signal transmitted (when the antenna is used for transmission) or received (when the antenna is used for reception) by each radiating element are adjusted so as to direct the antenna beam in the desired direction.

FIG. 1 summarizes the main elements in a transmission chain comprising an array antenna. The signal to be transmitted is shaped by means of various algorithms 101 for processing the signal (modulation, coding, interleaving, etc.) according to the communications standard, then converted into analogue and amplified by the transmission chain 102. The RF signal generated is transmitted to N unitary control nodes 103, together forming a beamforming network 104. Each control node is configured to apply a phase shift and a particular attenuation to the signal according to a control signal. The RF signal thus modified is transmitted to a particular radiating element 105 of the array antenna 106 in order to be transmitted. Choosing the amplitudes/phases applied by the control nodes makes it possible to control the direction of the RF signal transmitted by the antenna. Reception chains are similar, a particular phase and amplitude being applied by the control nodes to each RF signal received from the radiating elements of the array antenna.

Beamforming techniques are well known from the prior art, and used in particular on board satellites to create satellite spots.

Pointing accuracy depends on the number radiating elements of which the antenna is formed. Thus, antennas on board satellites generally comprise several tens of radiating elements. Given their number, the control nodes are dimension-determining elements in terms of weight, volume and consumption on board the satellite. For this reason, the technologies generally employed for implementing the control nodes are silicon technologies or technologies based on silicon/germanium mixtures, which afford good RF performance while being advantageous in terms of integration of functions and energy efficiency.

Each control node is controlled by a digital control signal. For a given number of bits of the control signal, there is therefore a finite number of amplitude/phase states that can be obtained. All of these states form a constellation of points. For example, for a 16-bit control configuration, the constellation comprises 65 536 different amplitude/phase states. Most current satellite systems use a 16-bit control signal, since this format is compatible with standard devices for series-parallel addressing, for storing command words in memory and for calibrating the array antenna. However, some application contexts (low satellite orbit, high relative frequency band, etc.) require the size of this constellation to be decreased to $2^{14}$=16 384 states, so as to reserve 2 bits from the 16 available for regulating the "group propagation time" parameter.

The unitary control nodes also have to meet resolution specifications with regard to the points of the constellation of states. For example, the phase setpoint should generally allow a 360° scan per step of constant size, and the amplitude dynamic range should be large (typically larger than 20 dB).

Control nodes based on what are called "polar" topologies are known from the prior art, with amplitude- and phase-fixed control step size.

FIG. 2a shows the overview of a unitary control node with polar topology controlled by a 2N-bit control signal. The control node then comprises an attenuator 201, composed of successive attenuation cells, which is configured to attenuate the RF input signal according to the value of N bits 210 of the control signal, and a phase-shifter 202 configured to apply, to the attenuated RF signal, a phase shift according to the value of N other bits 211 of the control signal. An identical result may be obtained by inverting the position of the attenuator 201 and phase-shifter 202.

In the examples described hereinafter, the case of a control signal with a size of 2N=14 bits will be considered by way of illustration. The invention is in no way limited to this number of bits because it is a common practice of those skilled in the art to vary the number of bits of the control signal. In this specific case, N=7 bits are dedicated to controlling the attenuator 201. It then comprises seven consecutive attenuation cells controlled by respective bits of the control signal, which allows each cell to be switched between the active and inactive state. The successive attenuation cells have an attenuation which doubles with each cell so as to provide a logarithmic progression with constant step size. In this example, it is then possible to apply 128 levels of attenuation to the RF signal. The desired amplitude dynamic range is then dependent on the attenuation step size. With MSB being the most significant bit and LSB being the least significant bit of the N dedicated bits of the control signal, then the attenuation step size of the attenuator corresponds to the attenuation of the cell associated with the LSB, the value of the attenuation of the cell associated with the MSB being $2^{N-1}$ times the attenuation of the cell associated with the LSB, and the value of the amplitude dynamic range being 2*MSB−LSB=($2^N$−1)*LSB.

Additionally, N=7 other bits 211 of the control signal are used to control the phase-shifter 202, which allows 128 distinct phase shifts to be applied to the signal, preferably distributed uniformly so as to cover the 360° of phase required by the array antenna system. The value of the phase step size is then $360°/2^N$.

Depending on what is desired regarding the phase accuracy and the amplitude dynamic range sought, the distribution of the control bits between the attenuator and the phase-shifter may be modified.

FIG. 2b shows the constellation of states obtained for control nodes using a polar topology, in the case of an ideal constellation, i.e. without parasitic distribution, for N=7. The constellation uniformly covers the unit circle, which corresponds to an attenuation of zero. The attenuations are given in decibels and shown on a logarithmic scale, which explains the fact that the distance between two successive states associated with one and the same phase decreases with increasing attenuation.

Although the polar representation is highly advantageous from a point of view of system operation given its uniform coverage, its implementation using silicon or silicon-germanium technology is highly disadvantageous in terms of area and trade-off on the set of required electrical performance properties (critical RF characteristics versus DC power consumed).

This is why unitary control nodes based on what are called "vector" topologies are also known from the prior art, with amplitude-fixed control step size on the I and Q channels.

FIG. 3a shows an overview of a unitary control node with vector topology controlled by a 2N-bit control signal. The control node comprises a quadratic divider 301 configured to generate, from the RF signal, an in-phase signal, commonly called channel I, and a phase quadrature signal, commonly called channel Q. Each channel comprises an attenuator 302/303 configured to attenuate the signal of the channel according to the value of N−1 bits 310/311 of the control signal, and an inverter 304/305, configured to invert or not to invert the signal transmitted over the channel depending on the value of a bit 312/313 of the control signal. The two signals are next recombined by a combiner 306. The quadratic divider may for example take the form of a coupler used in divider mode, configured to generate two output channels in quadrature. The combiner may for example take the form of a coupler used as a combiner, the input channels of which are in phase or in phase opposition.

In some variant implementations, the positions of the attenuators and inverters on each channel may be switched. Similarly, the quadratic divider 301 may be configured to generate four channels: the channels I and Q, and their inverses Ī and Q̄. Each channel then comprises an attenuator, but the attenuators of a channel and of its inverse are controlled by the same bits of the control signal (N−1 bits 310 of the control signal for the channels I and Ī, and N−1 bits 311 of the control signal for the channels Q and Q̄). The presence of inverters is then not required, but the combiner should be configured to combine two channels of the four, selected on the basis of two bits of the control signal.

The vector topology is highly advantageous in comparison with the polar topology in terms of implementation area, performance in terms of RF insertion loss and in terms of relative frequency bandwidth, in particular when implemented using silicon or silicon-germanium technology.

FIG. 3b shows the constellation of states obtained for control nodes using a vector topology, in the case of an ideal constellation, i.e. without parasitic distribution, and for a 2N=14-bit control signal. The attenuators 302/303 each comprise N−1=6 consecutive attenuation cells, each cell being controlled by a particular bit of the control signal. The attenuation performed by the cells doubles from one cell to the next, so as to provide an attenuation with constant step size in dB. In this example, it is then possible to apply 64 levels of attenuation to the RF signal on each channel, which makes it possible to describe 4096 amplitude/phase levels grouped together in one quadrant of the total constellation. The inverters allow these states to be transferred to the three other quadrants. Since the attenuation dynamic range provided to each channel is limited, depopulated regions 320 appear along the x- and y-axes, in which the constellation comprises no points.

Because of this, the vector topology does not adequately address the problem of uniform coverage over 360° and over the entire dynamic range sought.

Until now, the problem was solved by using one or more of the following techniques:

tolerating the presence of completely depopulated angles, such as the 0° angle in the case of FIG. 2b. Specifically, telecommunications standards make provision for margins on phase errors, but this solution is not satisfactory;

increasing the size of the control signal and the number of attenuation cells to increase, for constant step size, the amplitude dynamic range of the constellation and hence decrease the size of the depopulated regions. This solution is only partially satisfactory because increasing the size of the control signal leads to an increase in the amount of data transmitted to the satellite, in the complexity of the calibration phase, in the size of the calibration tables, and in the size of the series-parallel converters used to address the bits of the control signal;

increasing the step size of the least significant bit of the attenuators, so as to increase the amplitude dynamic range of the constellation for a constant number of control bits and hence decrease the size of the depopulated regions 330 and 340, as can be seen in FIGS. 3c and 3d, but this solution negatively affects the point density of the constellation and hence the resolution of the system;

using a hybrid method consisting in carrying out phase synthesis on a small dynamic range on the basis of a vector approach, recombining the I and Q signals and attenuating the totality after recombination. However, this approach is not very efficient in terms of implementation and resolution versus the total number of required bits of the control signal.

There is therefore a genuine need for a control node in an array antenna that makes it possible to obtain a uniform amplitude/phase constellation and that can be implemented efficiently using silicon or silicon-germanium technology, without increasing the number of bits of the control signal, without decreasing the resolution of the system, and without significantly affecting the area and power required.

SUMMARY OF THE INVENTION

To this end, the described invention relates to a control node with flexible digital control for amplitude/phase vector constellations which meets this need since it allows optimization of the resolution/dynamic range trade-off without modifying the number of bits of the control signal. This control node is based on an attenuator of which the attenuation cells for the RF signal allow differentiated addressing. It is easy to implement on any type of CMOS (complementary metal-oxide-semiconductor) silicon technology by virtue of its intrinsic combinatorial-logic function synthesis capability.

The invention therefore relates to an attenuator for an array antenna control node, configured to attenuate a radiofrequency signal according to a control signal, said attenuator comprising a plurality of first attenuation cells, each first attenuation cell being configured to attenuate said radiofrequency signal by a predetermined value and being activated according to a particular bit of the control signal, the attenuator being characterized in that it comprises a means for implementing a combinatorial logic on the basis of the bits of the control signal that are used to control the first attenuation cells, and at least one second attenuation cell, each second attenuation cell being configured to attenuate said radiofrequency signal by a predetermined value and being activated according to a particular output of the means for implementing a combinatorial logic.

According to various embodiments, the means for implementing a combinatorial logic is a preprogrammed table, a digital computing device or an integrated electronic circuit.

Advantageously, the means for implementing a combinatorial logic are configured to activate the second attenuation cells only when the first attenuation cells are in their 2M−1 highest attenuation states.

In one embodiment, the attenuator further comprises one or more blocks of additional attenuation cells, each block comprising at least one attenuation cell, each attenuation cell of a block being configured to attenuate said radiofrequency signal by a predetermined value and being activated according to an output of the means for implementing a combinatorial logic, wherein the attenuation of the cell of lowest attenuation of the second attenuation cells and the attenuation of the cell of lowest attenuation of each of said one or more blocks of additional attenuation cells are different.

The invention also relates to a control node for an array antenna, comprising at least one quadratic divider that takes, as input, a radiofrequency signal and delivers at least one in-phase signal and one phase quadrature signal over distinct transmission channels and a combiner configured to generate an output radiofrequency signal by summing the signals transmitted over two of the transmission channels, the control node being characterized in that it comprises, for each transmission channel, an attenuator such as described above.

According to one embodiment of the control node, the quadratic divider is configured to deliver an in-phase signal and a quadrature signal, and wherein each transmission channel further comprises an inverter configured to invert the signal transmitted over the transmission channel according to said control signal.

According to another embodiment of the control node, the quadratic divider is configured to deliver, over four different transmission channels, an in-phase signal, an inverse signal of the in-phase signal, a phase quadrature signal and an inverse signal of the phase quadrature signal, and wherein the combiner is configured to combine the signals transmitted over two selected transmission channels according to said control signal.

Lastly, the invention relates to an array antenna comprising:
a plurality of radiating elements configured to transmit or receive a radiofrequency signal; and
one control node according to the invention per radiating element, the control node being configured to shape the radiofrequency signal to be transmitted or to shape the radiofrequency signal received according to a control signal,
and to a satellite comprising such an array antenna.

BRIEF DESCRIPTION OF THE FIGURES

The invention will be better understood and other features and advantages will become more clearly apparent upon reading the non-limiting description which follows, and by virtue of the appended figures.

Hereinafter, when the same references are used in the figures, they denote the same elements.

DETAILED DESCRIPTION

The control node that is the subject of the invention has a vector structure, and incorporates an attenuator configured to allow a greater dynamic range than the attenuators of the prior art without however modifying the amplitude step size or the number of bits of the control signal.

Figure 4A:
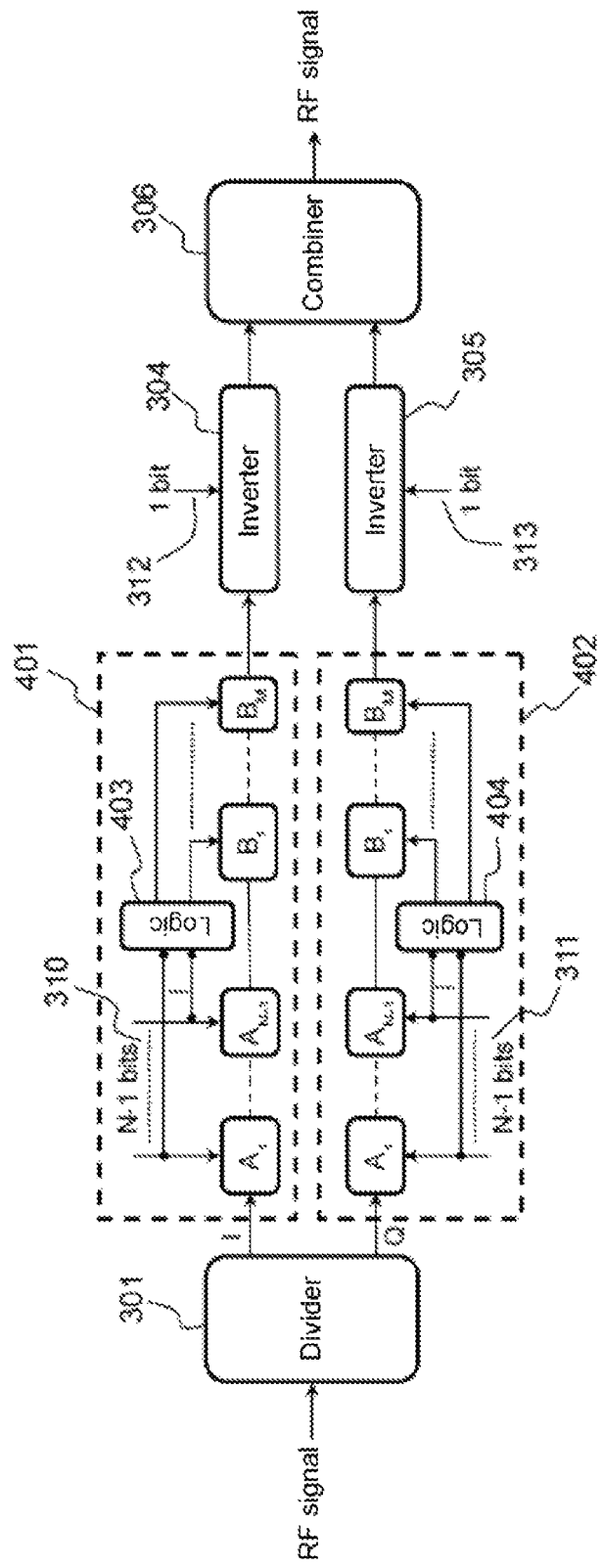
FIG. 4a shows a control node according to one embodiment of the invention.

FIG. 4a shows a unitary control node according to a first embodiment of the invention. This control node takes, as input, an RF signal to be transmitted over a particular radiating element of the array antenna. It comprises a quadratic divider 301 configured to generate an in-phase channel I and a phase quadrature channel Q on the basis of the RF signal. Each channel comprises an attenuator 401/402 controlled by N−1 particular bits of the control signal, and an inverter 304/305 controlled by one particular bit of the control signal. The signals are next recombined by an RF combiner 306, which sums the signals transmitted over the two channels in phase or in phase opposition.

The attenuator 401 comprises N−1 attenuation cells Ai, where i∈[1, N−1], which are configured to attenuate the radiofrequency signal by a predetermined value according to the value 310/311 of N−1 particular bits of the control signal. So as to ensure a constant amplitude step size, the attenuation doubles with each cell. Each cell is controlled by a particular bit of the control signal, which controls the generation of an analogue control signal which activates or deactivates the attenuation cell, such that it can be controlled by a digital command.

The attenuator 401 according to one embodiment of the invention comprises a means 403 for implementing a combinatorial logic allowing additional control signals to be generated from the bits of the control signal used to control the first attenuation cells. In the embodiment described, the means for implementing a combinatorial logic takes the form of an electronic circuit of logic components taking, as input, the analogue signals for controlling the set of cells Ai in order to generate one or more setpoint signals.

The attenuator 41 also comprises M additional attenuation cells Bj, where j is between 1 and M, which are configured to attenuate the radiofrequency signal by a predetermined value according to one of the signals generated by the computing means 403. These cells are therefore configured to be activated not according to the M additional bits of the control signal, but according to an optimized combination of the set of N−1 bits of the control signal used for the cells Ai. In this way, the attenuation cells Bj allow the amplitude dynamic range of the constellation to be extended without modifying the initial resolution set by the value of the least significant bit of the attenuation cells Ai (and hence without modifying the amplitude step size) or increasing the number of bits of the control signal.

The combinatorial logic allows the additional cells Bj to be activated on particular states of the control signal. Advantageously, it is chosen so as to activate the additional cells Bj on the 2M−1 last states of the truth table [A1, . . . , AN−1]. Specifically, choosing these states makes it possible to increase the dynamic range without creating a "coverage gap" in the middle of the attenuation control distribution. Additionally, they correspond to little-used regions of the constellation, and moving them positively affects the performance of the system by increasing the coverage area.

The attenuation value of the cells Bj may be chosen according to the number M of cells and the additional amplitude dynamic range sought. As such, the attenuation value chosen for the least significant cell of the additional cells Bi will depend on the attenuation dynamic range of the cells Ai, on the number M of additional cells and on the desired resolution in the depopulated region. Just like for the cells Ai, the level of attenuation of the additional attenuation cells Bj doubles from cell to cell.

Table 1 describes an example of attenuations obtained by choosing N=7, M=2, A1=0.3 dB and B1=2 dB, and where the cells Bj are activated on the three last states of the truth table.

TABLE 1

| Ctrl | Att. A (dB) | Att. B (dB) | Total att. (dB) |
| --- | --- | --- | --- |
| 000000 | 0.0 | 0 | 0 |
| 000001 | 0.3 | 0 | 0.3 |
| 000010 | 0.6 | 0 | 0.6 |
| 000011 | 0.9 | 0 | 0.9 |
| 000100 | 1.2 | 0 | 1.2 |
| 000101 | 1.5 | 0 | 1.5 |
| 000110 | 1.8 | 0 | 1.8 |
| 000111 | 2.1 | 0 | 2.1 |
| 001000 | 2.4 | 0 | 2.4 |
| 001001 | 2.7 | 0 | 2.7 |
| 001010 | 3.0 | 0 | 3 |
| 001011 | 3.3 | 0 | 3.3 |
| 001100 | 3.6 | 0 | 3.6 |
| 001101 | 3.9 | 0 | 3.9 |
| 001110 | 4.2 | 0 | 4.2 |
| 001111 | 4.5 | 0 | 4.5 |
| 010000 | 4.8 | 0 | 4.8 |
| 010001 | 5.1 | 0 | 5.1 |
| 010010 | 5.4 | 0 | 5.4 |
| 010011 | 5.7 | 0 | 5.7 |
| 010100 | 6.0 | 0 | 6 |
| 010101 | 6.3 | 0 | 6.3 |
| 010110 | 6.6 | 0 | 6.6 |
| 010111 | 6.9 | 0 | 6.9 |
| 011000 | 7.2 | 0 | 7.2 |
| 011001 | 7.5 | 0 | 7.5 |
| 011010 | 7.8 | 0 | 7.8 |
| 011011 | 8.1 | 0 | 8.1 |
| 011100 | 8.4 | 0 | 8.4 |
| 011101 | 8.7 | 0 | 8.7 |
| 011110 | 9.0 | 0 | 9 |
| 011111 | 9.3 | 0 | 9.3 |
| 100000 | 9.6 | 0 | 9.6 |
| 100001 | 9.9 | 0 | 9.9 |
| 100010 | 10.2 | 0 | 10.2 |
| 100011 | 10.5 | 0 | 10.5 |
| 100100 | 10.8 | 0 | 10.8 |
| 100101 | 11.1 | 0 | 11.1 |
| 100110 | 11.4 | 0 | 11.4 |
| 100111 | 11.7 | 0 | 11.7 |
| 101000 | 12.0 | 0 | 12 |
| 101001 | 12.3 | 0 | 12.3 |
| 101010 | 12.6 | 0 | 12.6 |
| 101011 | 12.9 | 0 | 12.9 |
| 101100 | 13.2 | 0 | 13.2 |
| 101101 | 13.5 | 0 | 13.5 |
| 101110 | 13.8 | 0 | 13.8 |
| 101111 | 14.1 | 0 | 14.1 |
| 110000 | 14.4 | 0 | 14.4 |
| 110001 | 14.7 | 0 | 14.7 |
| 110010 | 15.0 | 0 | 15 |
| 110011 | 15.3 | 0 | 15.3 |
| 110100 | 15.6 | 0 | 15.6 |
| 110101 | 15.9 | 0 | 15.9 |
| 110110 | 16.2 | 0 | 16.2 |
| 110111 | 16.5 | 0 | 16.5 |
| 111000 | 16.8 | 0 | 16.8 |
| 111001 | 17.1 | 0 | 17.1 |
| 111010 | 17.4 | 0 | 17.4 |
| 111011 | 17.7 | 0 | 17.7 |
| 111100 | 18.0 | 0 | 18 |
| 111101 | 18.3 | 2 | 20.3 |
| 111110 | 18.6 | 4 | 22.6 |
| 111111 | 18.9 | 6 | 24.9 |

When the control signal Cmde varies between 000000 and 111100, the cells Bj are inactive. The total attenuation of the attenuator then corresponds to the attenuation provided by the cells Ai, and has a maximum value of 18 dB. When the value of the control signal is 111101, the least significant cell Bj is activated, and makes it possible to obtain an additional attenuation of the RF signal by 2 dB, which is added to the 18.3 dB of attenuation of the cells Ai. Similarly, when the value of the control signal is 111110 and 111111, the cells Bj make it possible to obtain an increase in attenuation with a value of 4 dB and 6 dB, respectively. The additional cells Bj therefore bring the total dynamic range of the constellation to 24.9 dB instead of 18.9 dB, without increasing the size of the control signal, and by modifying the step size of the constellation only on the three last states, since rather than introducing new states into the constellation, the additional attenuation cells increase the attenuation of existing and little-used states of the constellation.

The combinatorial logic required to implement the invention is very simple: denoting the bits of the control signal by Cmdei, i varying between 1 and 6 and Cmde1 being the least significant bit, the least significant additional cell B1 (2 dB of attenuation) is activated if and only if the bits Cmde1, Cmde3, Cmde4, Cmde5 and Cmde6 have a value of 1. The cell B2 (4 dB of attenuation) is activated if and only if the bits Cmde2, Cmde3, Cmde4, Cmde5 and Cmde6 have a value of 1. The means for implementing the combinatorial logic may therefore be implemented in the form of an integrated circuit composed of a series of elementary "AND" logic gates, thus making the physical solution highly compact.

Figure 1:
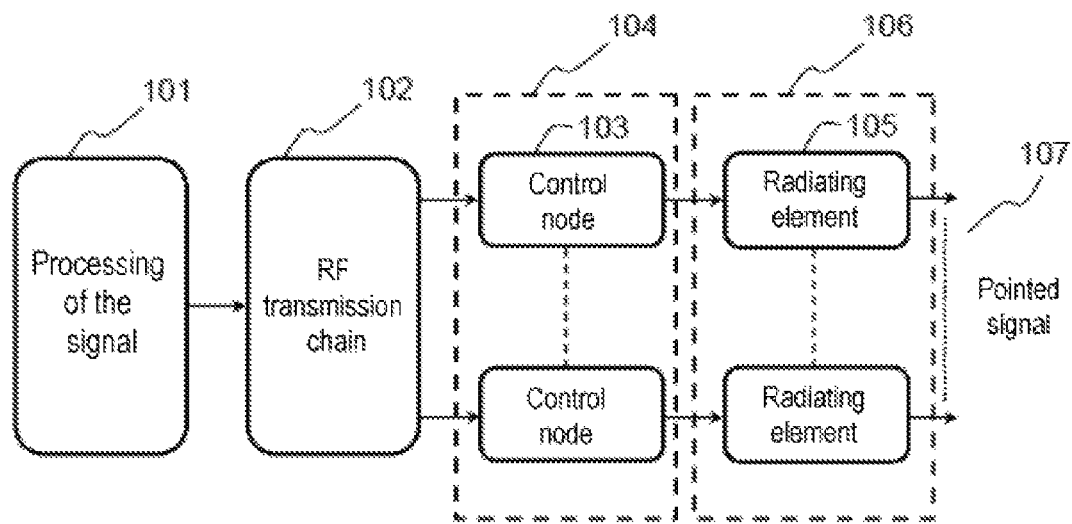
FIG. 1 summarizes the main elements in a transmission chain comprising an array antenna.
Figure 2A:
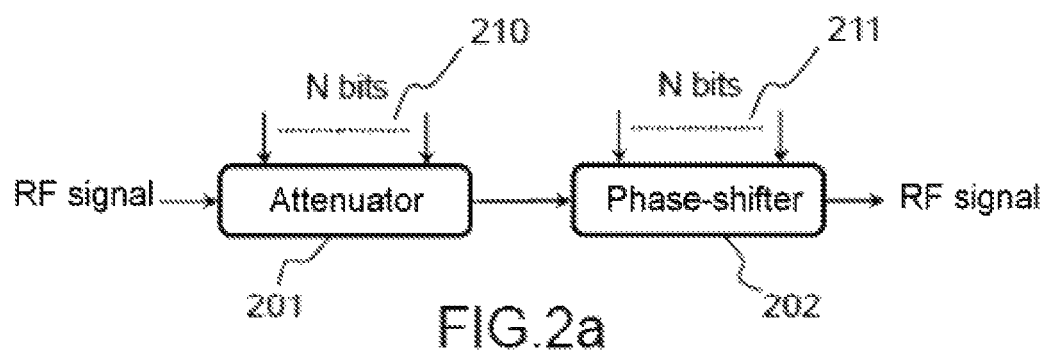
FIG. 2a shows the overview of the main elements of a unitary control node with polar topology for an array antenna.
Figure 2B:
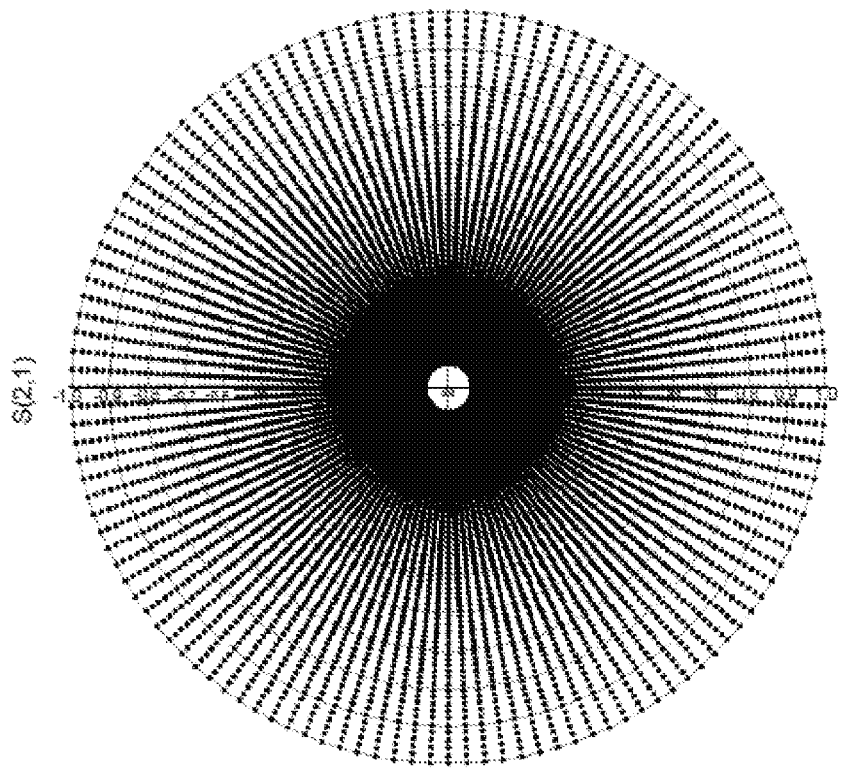
FIG. 2b shows the constellation of states obtained for a control node using a polar topology, in the case of an ideal constellation.
Figure 3A:
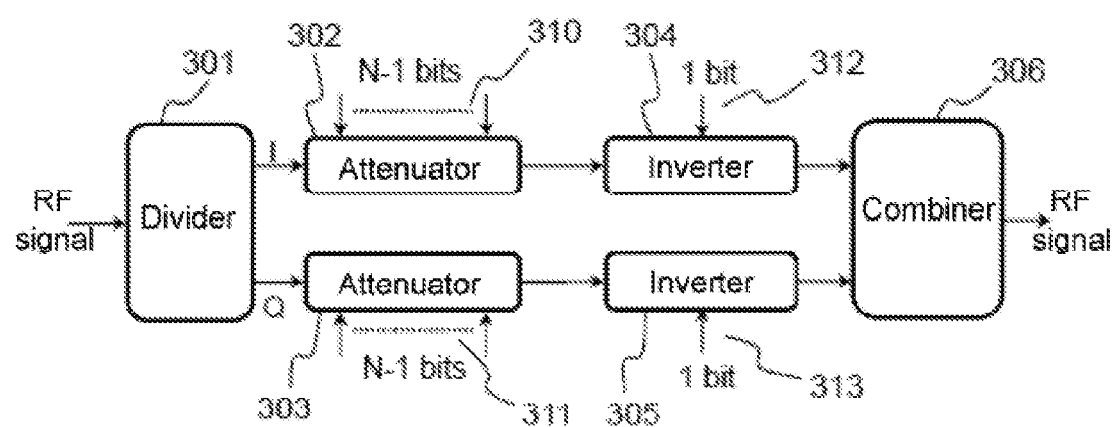
FIG. 3a shows the overview of the main elements of a unitary control node with vector topology for an array antenna.
Figure 3B:
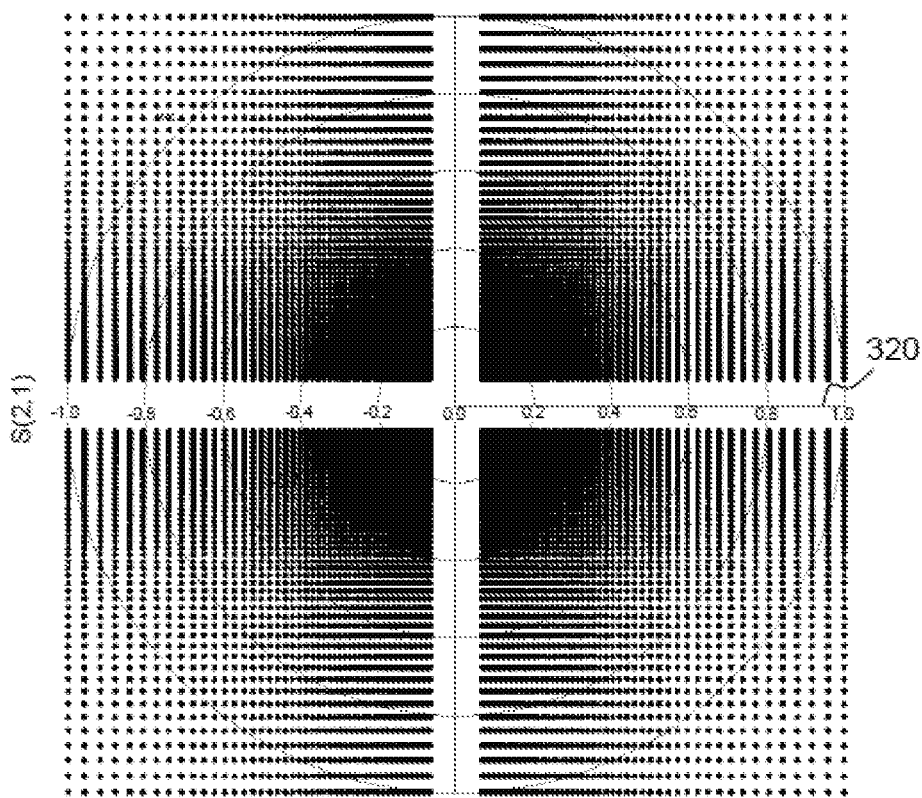
FIG. 3b shows the constellation of states obtained for a control node using a vector topology, in the case of an ideal constellation.
Figure 3C:
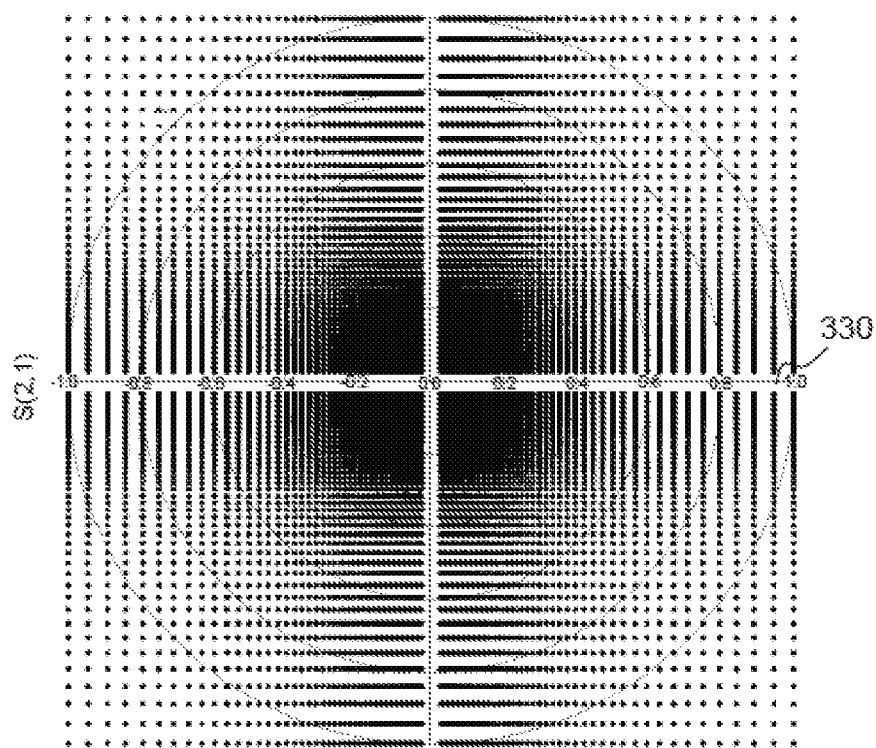
FIG. 3c shows another constellation of states obtained for a control node using a vector topology.
Figure 3D:
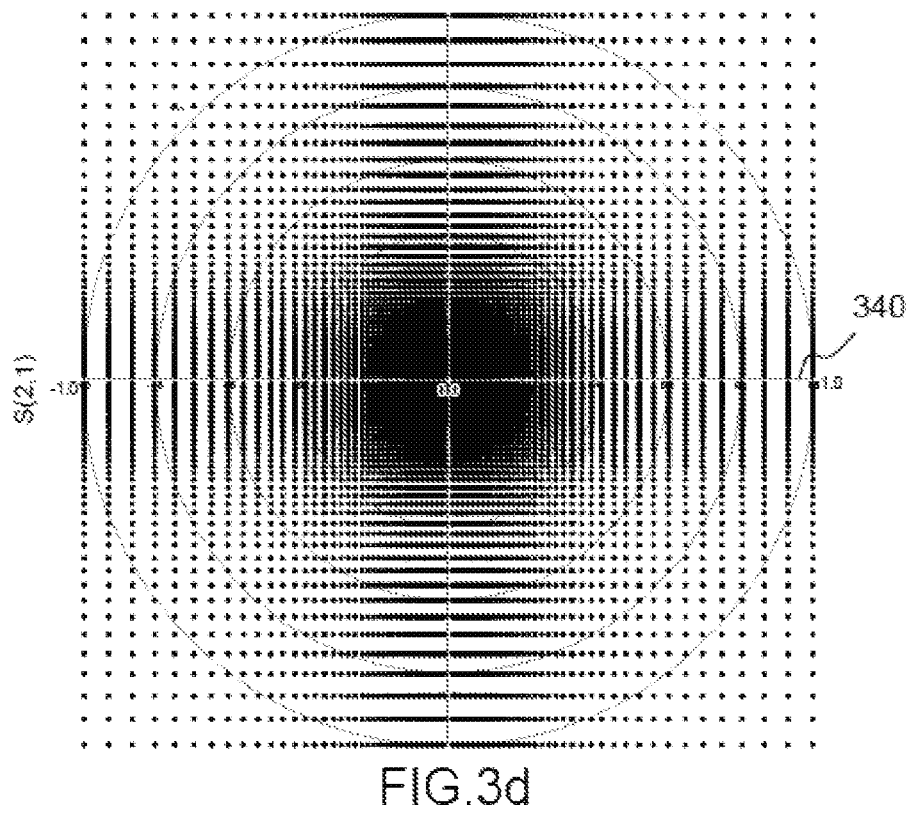
FIG. 3d shows another constellation of states obtained for a control node using a vector topology.
Figure 4B:
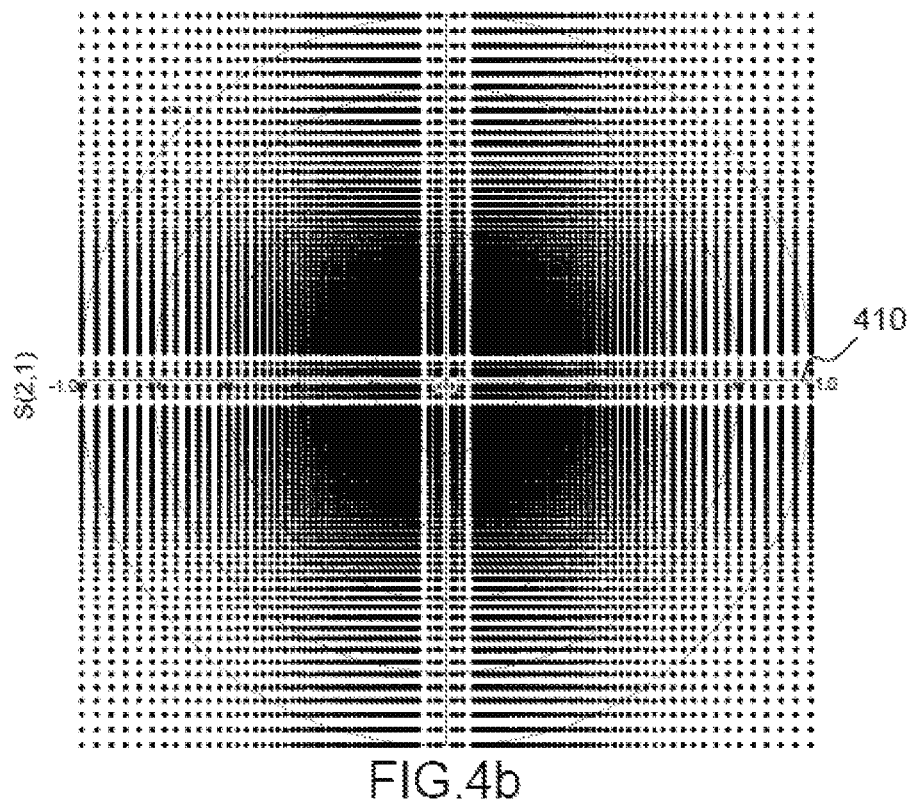
FIG. 4b shows the constellation of states obtained for a unitary control node according to one embodiment of the invention.
Figure 4C:
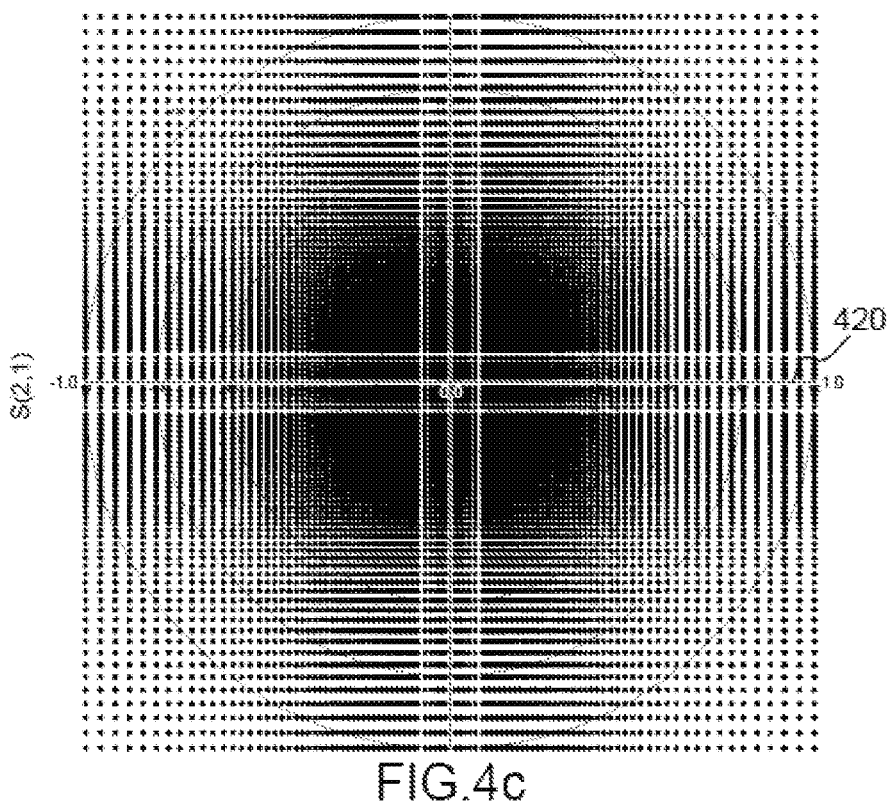
FIG. 4c shows the constellation of states obtained for a unitary control node according to another embodiment of the invention.

FIGS. 4b and 4c illustrate the constellation obtained by implementing an attenuator according to the invention in the case of a vector constellation under the conditions of FIG. 3b where the value of M is 2 and 3, respectively. It can be seen there that the depopulated region 410 and 420 is decreased in comparison with the depopulated region of FIG. 3b, and that the point density in the depopulated region increases with M.

The proposed solution therefore well addresses the problem of filling the depopulated regions of a constellation generated by a vector control node without increasing the control size or the step size of the constellation. Its effect on the size of the control node component is limited, the addition of an additional cell B approximately resulting in an increase in the area of the printed circuit by about 2 to 3%. The additional RF losses are reasonable from a point of view of system operation.

The proposed solution allows great flexibility in adapting to operational requirements since it is adjustable along two axes: the number of cells Bj may be increased or decreased, and the value of the least significant adaptation cell B1 may be modified. As such, the structure of the attenuator may be adjusted for a greater amplitude dynamic range in order to fill the depopulated regions. It is referred to as a two-scale concept because the attenuation cells Ai and Bj each attenuate the RF signal according to a particular scale. This concept may very easily be extended to a multiscale concept by adding additional blocks of attenuation cells (for example Ck) controlled on specific states of the control signal in order to further increase the attenuation dynamic range or to better adjust the step size of the constellation in the depopulated regions. Advantageously, the attenuation value of the least significant cell of the cells Ck will then be different from that of the least significant cell of the cells Bj so as to further increase design flexibility and performance of the control node in relation to the attenuation distribution.

Figure 5A:
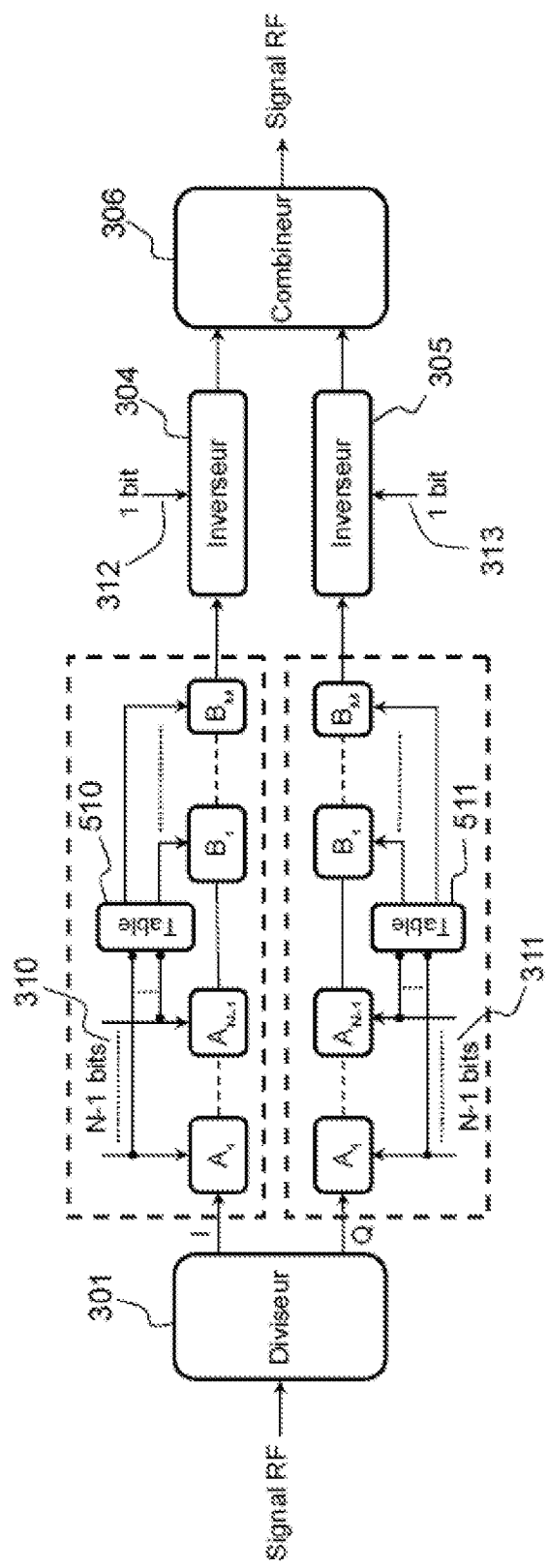
FIG. 5a shows a control node according to one embodiment of the invention.

FIG. 5a shows another embodiment of the invention, which is similar in all respects with that presented in FIG. 4a apart from with respect to the means 510/511 for implementing a combinatorial logic. In this embodiment, the combinatorial logic is applied to the digital control signal, either by means of a digital computing component (such as for example a digital signal processor (DSP) or any other equivalent device suitable for performing digital computations), or by means of a pre-computed lookup table relating the values of the control signal to the activation of the attenuation cells Bj.

Figure 5B:
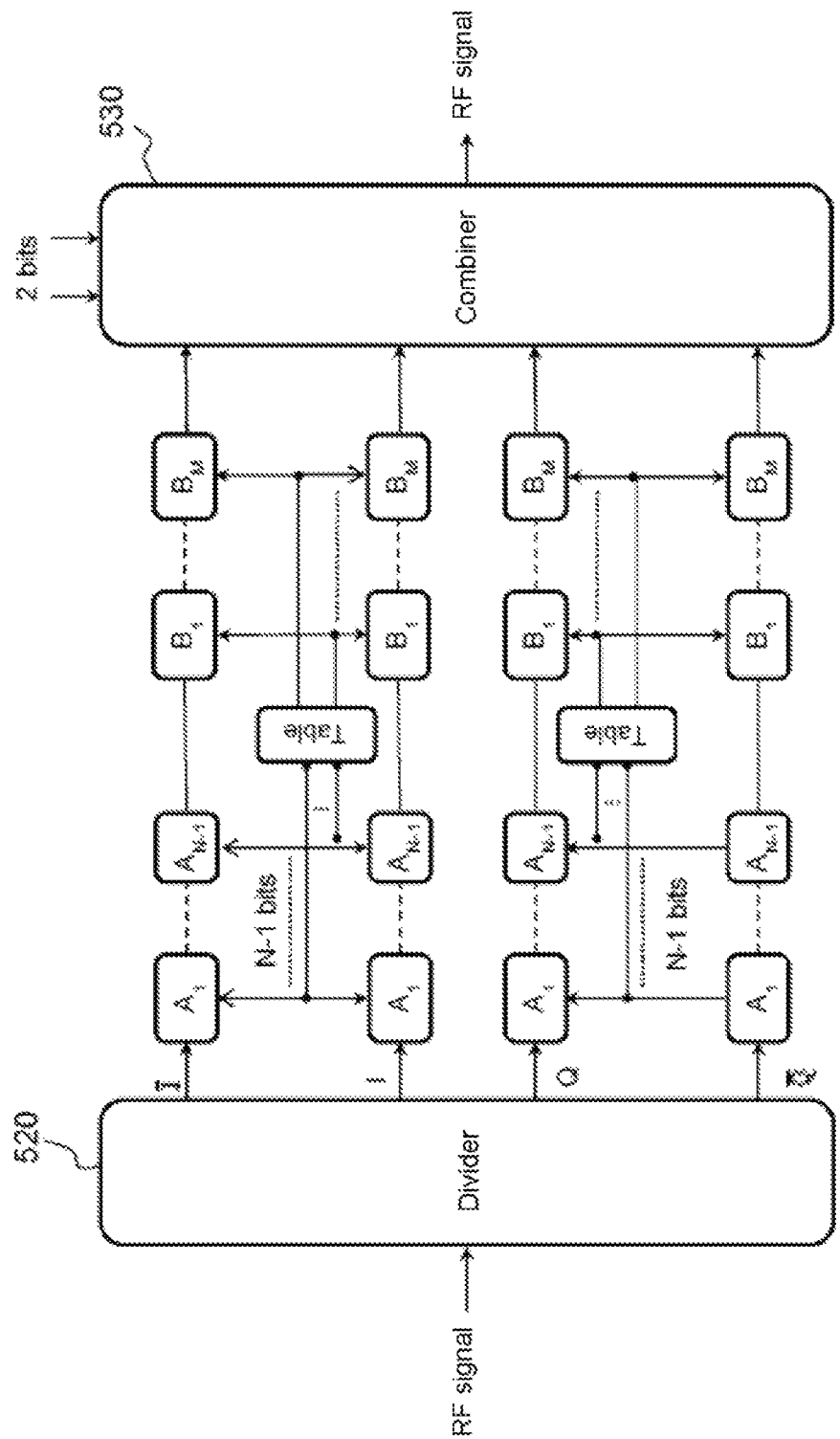
FIG. 5b shows a control node according to one embodiment of the invention.

FIG. 5b shows another embodiment of the invention, which differs from that shown in FIG. 4a in that the quadratic divider 520 is configured to generate, from the RF signal: an in-phase channel I, a channel $\bar{I}$ that is the inverse of the channel I, a phase quadrature channel Q, and a channel $\bar{Q}$ that is the inverse of the channel Q. An attenuator such as described above, comprising first attenuation cells Ai and second attenuation cells Bj, is arranged on each of the transmission channels. The control signal used to control the attenuator of a channel and the inverse channel is the same. The combiner 530 is configured to select a first channel from the channels I and $\bar{I}$, and a second channel from the channels Q and $\bar{Q}$, and to combine these two channels in order to deliver the output RF signal of the control node. The means for implementing the combinatorial logic may equally be an integrated analogue circuit, such as for FIG. 4a, a digital computing device or a table, such as for FIG. 5a.

Figure 6A:
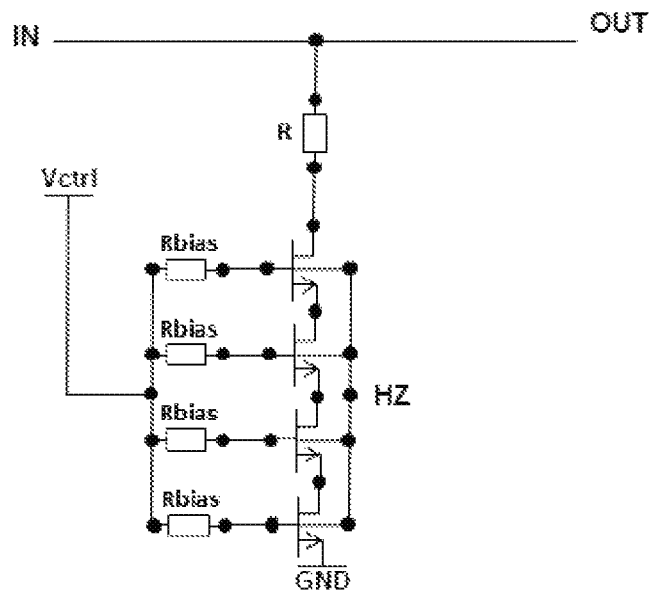
FIG. 6a shows the structure of an attenuation cell.
Figure 6B:
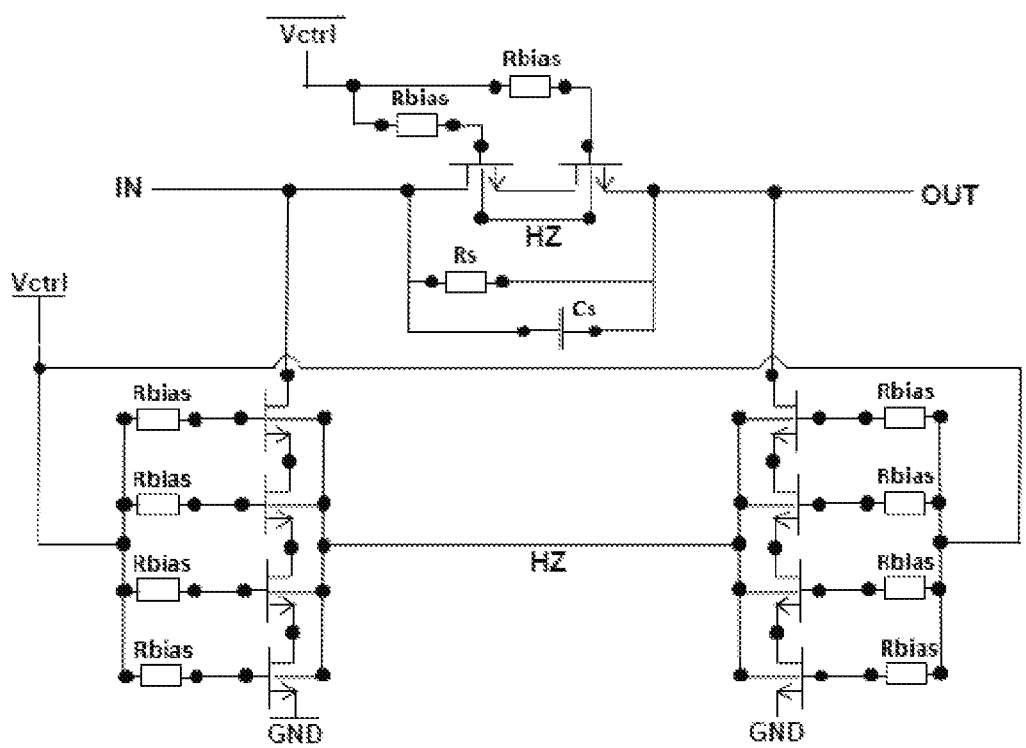
FIG. 6b shows the structure of an attenuation cell.

FIGS. 6a and 6b show two embodiments of an attenuation cell as an integrated circuit such as known from the prior art, given by way of illustration. An attenuation cell takes, as input, a radiofrequency IN signal and delivers a radiofrequency OUT signal. Depending on the value of a control voltage Vctrl, the cell attenuates the radiofrequency signal by a determined value or allows it through without modifying it (OUT=IN). For this, each cell forms an electrical circuit of which the choice of components (Rs, Rbias, Cs), of their values and of their arrangements makes it possible to determine the attenuation performed. The control voltage Vctrl is applied as a gate voltage for the transistors, and makes it possible to define their on or off state. In this way, the activation of the control voltage Vctrl according to a particular bit of the control signal makes it possible to control the active/inactive state of the attenuation cell. FIGS. 6a and 6b illustrate two embodiments of an attenuation cell, but numerous other arrangements are known to those skilled in the art, which could be used in the same way to implement the described invention. FIG. 6a performs a rather weak attenuation on the radio signal, and would be particularly suitable for embodying the least significant attenuation cell, while FIG. 6b performs a stronger attenuation, and would be particularly suitable for embodying the most significant attenuation cell.

The described attenuation cell with two scales, a first scale linked to the attenuators Ai and a second scale linked to the attenuators Bj, is therefore an optimized solution for vector synthesis of amplitude/phase constellations applied to beamforming networks of array antennas. The device, based on the integration of additional attenuation cells Bj that can be controlled according to a combinatorial logic on the control bits of the cells Ai constituting the reference plan, allows greatly increased design flexibility to make the best trade-off between dynamic range and resolution of the system, without affecting the number of associated control bits.

The invention also relates to an array antenna comprising a beamforming network integrating unitary control nodes such as described above, and to a satellite with such an antenna on board.

The invention claimed is:

1. An attenuator for an array antenna control node, configured to attenuate a radiofrequency signal according to a control signal, said attenuator comprising a plurality of first attenuation cells ($A_1$, $A_{N-1}$), each first attenuation cell being configured to attenuate said radiofrequency signal by a predetermined value and being activated according to a particular bit of the control signal, the attenuator being characterized in that it comprises a means for implementing a combinatorial logic on the bits of the control signal that are used to control the first attenuation cells, and at least one second attenuation cell ($B_1$, $B_M$), each second attenuation cell being configured to attenuate said radiofrequency signal by a predetermined value and being activated according to a particular output of the means for implementing a combinatorial logic.

2. The attenuator according to claim 1, wherein the means for implementing a combinatorial logic is a preprogrammed table.

3. The attenuator according to claim 1, wherein the means for implementing a combinatorial logic is a digital computing device.

4. The attenuator according to claim 1, wherein the means for implementing a combinatorial logic is an integrated electronic circuit.

5. The attenuator according to claim 1, comprising M second attenuation cells, wherein the means for implementing a combinatorial logic are configured to activate the second attenuation cells only when the first attenuation cells are in their $2^M-1$ highest attenuation states.

6. The attenuator according to claim 1, further comprising one or more blocks of additional attenuation cells, each block comprising at least one attenuation cell, each attenuation cell of a block being configured to attenuate said radiofrequency signal by a predetermined value and being activated according to an output of the means for implementing a combinatorial logic, wherein the attenuation of the cell of lowest attenuation of the second attenuation cells and the attenuation of the cell of lowest attenuation of each of said one or more blocks of additional attenuation cells are different.

7. The control node for the array antenna, comprising at least one quadratic divider that takes, as input, an input radiofrequency signal and delivers at least one in-phase signal and one phase quadrature signal over distinct transmission channels and a combiner configured to generate an output radiofrequency signal by summing the signals transmitted over two of the transmission channels, the control node comprising, for each transmission channel, an attenuator according to claim 1.

8. The control node according to claim 7, wherein the quadratic divider is configured to deliver the in-phase signal and the phase quadrature signal, and wherein each transmission channel further comprises an inverter configured to invert the signal transmitted over the transmission channel according to said control signal.

9. The control node according to claim 7, wherein the quadratic divider is configured to deliver, over four different transmission channels, the in-phase signal, an inverse signal of the in-phase signal, the phase quadrature signal and an inverse signal of the phase quadrature signal, and wherein the combiner is configured to combine the signals transmitted over two selected transmission channels according to said control signal.

10. The array antenna comprising: a plurality of radiating elements configured to transmit or receive the radiofrequency signal; one of the control node according to claim 7 per radiating element, the control node being configured to shape the radiofrequency signal to be transmitted or to shape the radiofrequency signal received according to a control signal.

11. A satellite comprising an array antenna according to claim 10.

* * * * *